US012085953B2

(12) United States Patent
Fan et al.

(10) Patent No.: US 12,085,953 B2
(45) Date of Patent: Sep. 10, 2024

(54) INSTALLATION AND RELOCATION OF MOBILE STOCKER

(71) Applicant: Taiwan Semiconductor Manufacturing Company, Ltd., Hsinchu (TW)

(72) Inventors: Rong Syuan Fan, Taoyuan (TW); Ching-Jung Chang, Taichung (TW); Chi-Feng Tung, Jhunan Township (TW); Hsiang Yin Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 566 days.

(21) Appl. No.: 17/304,912

(22) Filed: Jun. 28, 2021

(65) Prior Publication Data

US 2022/0344187 A1    Oct. 27, 2022

Related U.S. Application Data

(60) Provisional application No. 63/201,318, filed on Apr. 23, 2021.

(51) Int. Cl.
*G05D 1/00*        (2024.01)
*G06Q 10/087*    (2023.01)
*B65G 1/137*      (2006.01)

(52) U.S. Cl.
CPC ......... *G05D 1/0278* (2013.01); *G06Q 10/087* (2013.01); *B65G 1/1371* (2013.01)

(58) Field of Classification Search
CPC ... G05D 1/0278; G06Q 10/087; B65G 1/1371
See application file for complete search history.

(56) References Cited

U.S. PATENT DOCUMENTS 11,735,451 B2 *  8/2023  Li ................... H01L 21/67733
                                                              206/521
11,839,981 B2 * 12/2023  Dan ................. H01L 21/67724
(Continued)

FOREIGN PATENT DOCUMENTS

CN        106225382 A    12/2016
TW        201943516 A    11/2019
(Continued)

*Primary Examiner* — Ramsey Refai
(74) *Attorney, Agent, or Firm* — Harrity & Harrity, LLP

(57) ABSTRACT

A mobile stocker described herein is configured to be easily installed and relocated to various locations in a semiconductor fabrication facility. The mobile stocker is capable of being programmed with, and/or autonomously learning, the layout of a semiconductor fabrication facility, and automatically relocating to a new location based on the layout using a navigation system. Accordingly, the mobile stocker is capable of being flexibly relocated in the semiconductor fabrication facility to dynamically support changes in demand and production capacity. Moreover, the capability to quickly assign a location identifier to the mobile stocker and to automatically interface with transport systems in the semiconductor fabrication facility reduces downtime of the mobile stocker, which increases productivity in the semiconductor fabrication facility.

20 Claims, 15 Drawing Sheets

(56) References Cited

U.S. PATENT DOCUMENTS

| | | | |
|---|---|---|---|
| 2016/0129592 A1* | 5/2016 | Saboo | B25J 15/0625 |
| | | | 700/248 |
| 2016/0176638 A1* | 6/2016 | Toebes | B66F 9/06 |
| | | | 701/25 |
| 2018/0186572 A1* | 7/2018 | Issing | B65G 1/1375 |
| 2020/0230822 A1* | 7/2020 | Sohmshetty | B25J 5/06 |
| 2020/0262072 A1 | 8/2020 | Bryner et al. | |
| 2020/0310399 A1* | 10/2020 | Qi | G01C 21/16 |
| 2020/0364653 A1* | 11/2020 | Rongley | H04L 9/3213 |
| 2021/0098275 A1 | 4/2021 | Li et al. | |
| 2021/0276805 A1* | 9/2021 | Rongley | B65G 1/137 |
| 2021/0339393 A1 | 11/2021 | Dan | |
| 2022/0044958 A1 | 2/2022 | Avanzino et al. | |
| 2022/0083063 A1* | 3/2022 | Ben Shalom | G06V 20/54 |

FOREIGN PATENT DOCUMENTS

| | | |
|---|---|---|
| TW | 202101651 A | 1/2021 |
| TW | 202114047 A | 4/2021 |

\* cited by examiner

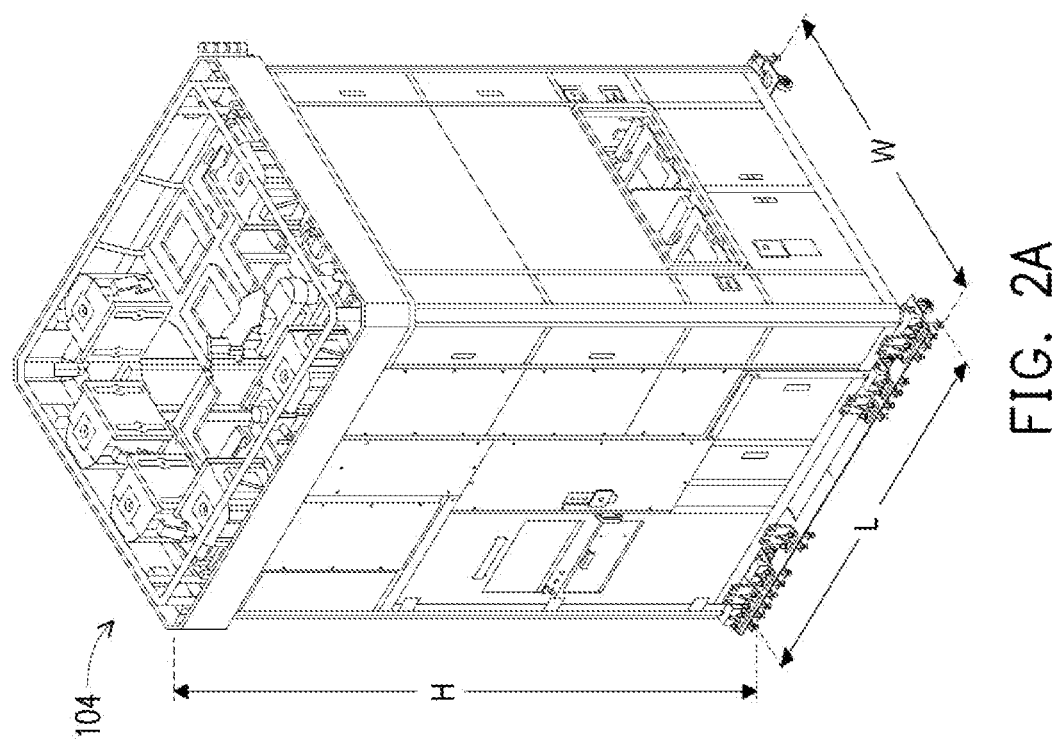

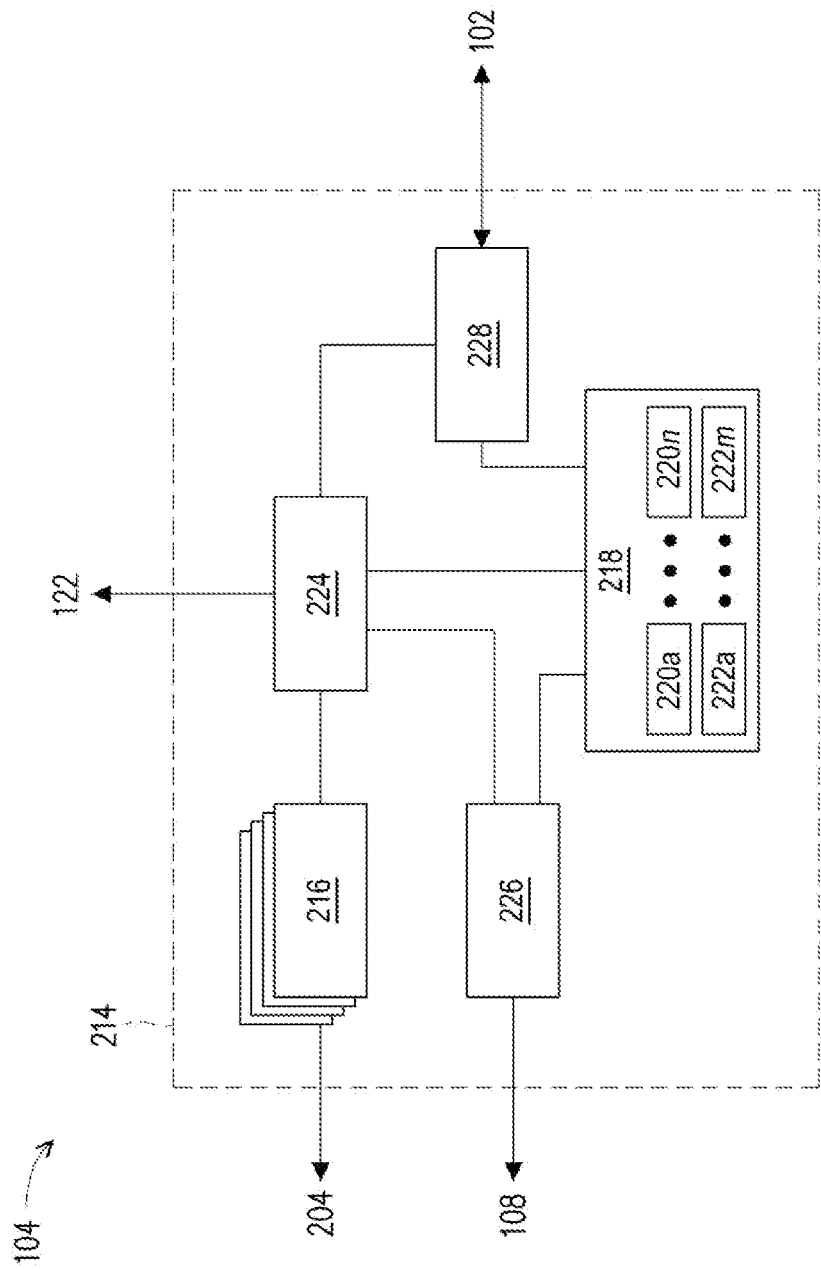

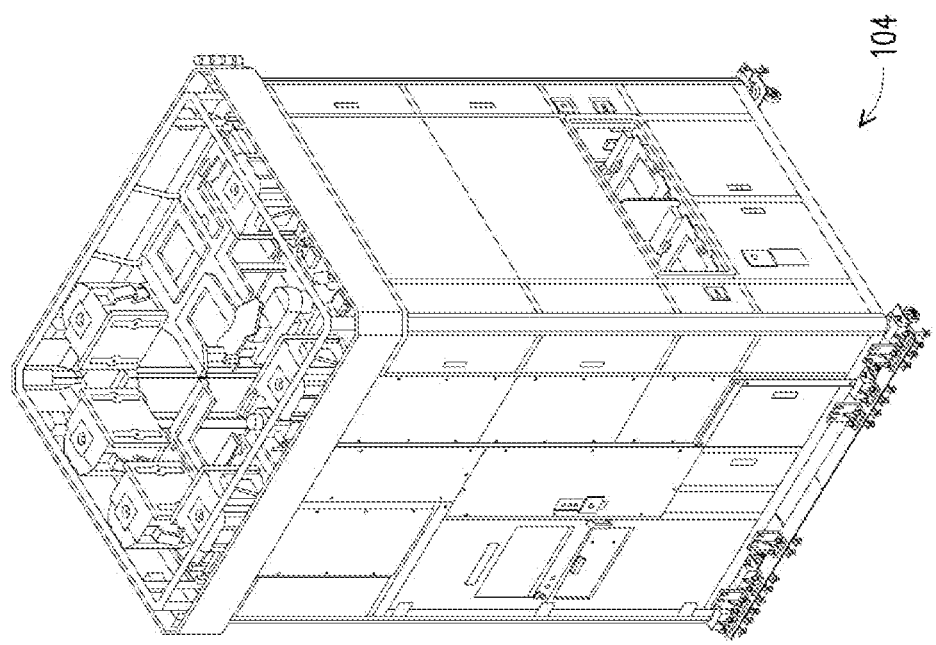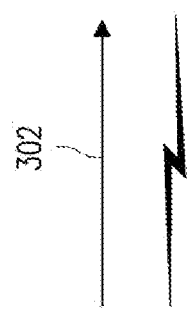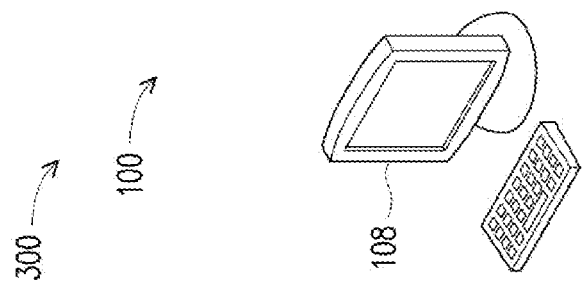
FIG. 3B

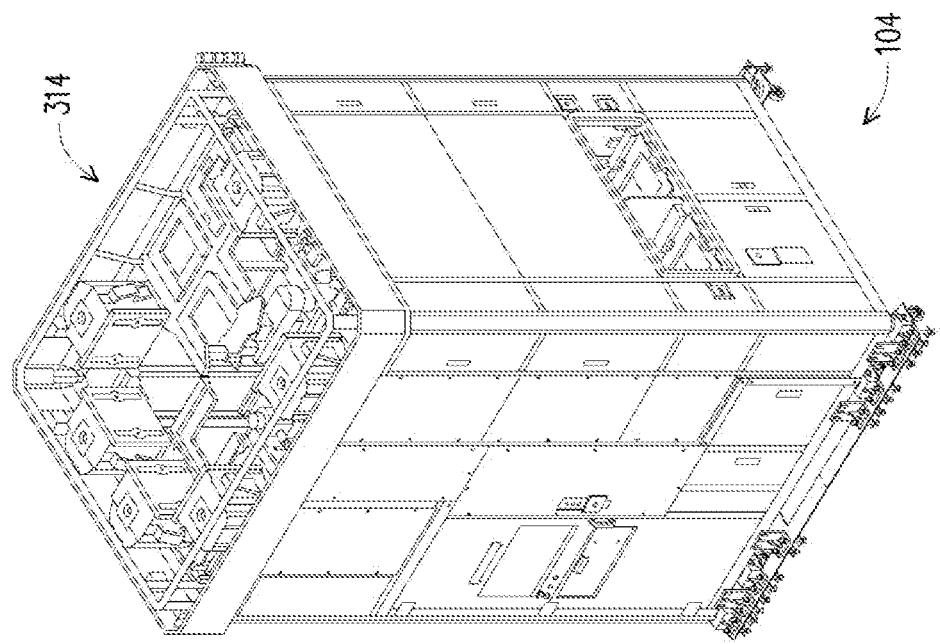
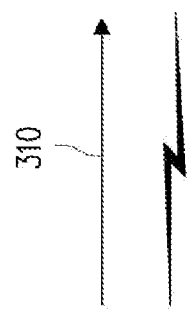
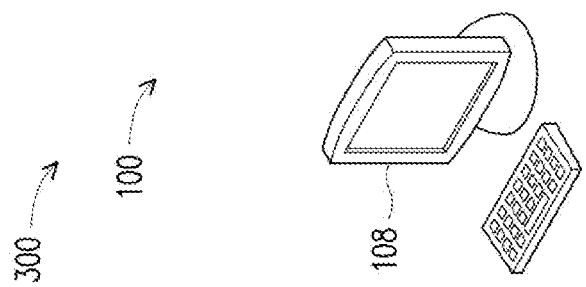
FIG. 3F

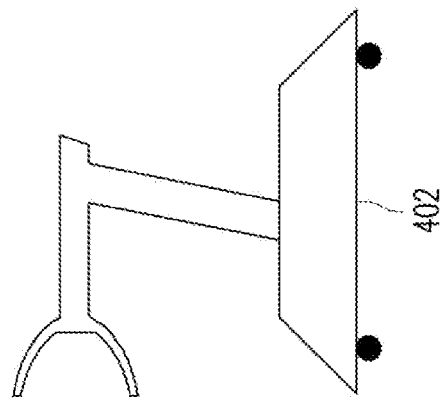
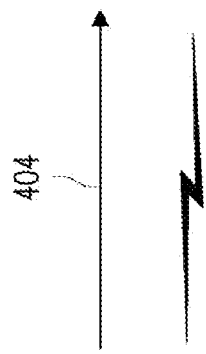
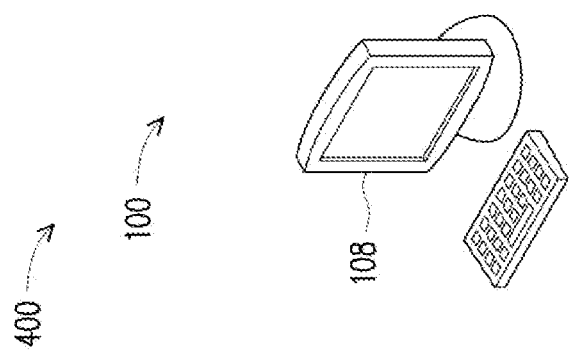
FIG. 4A

INSTALLATION AND RELOCATION OF MOBILE STOCKER

CROSS-REFERENCE TO RELATED APPLICATION

This patent application claims priority to U.S. Provisional Patent Application No. 63/201,318, filed on Apr. 23, 2021, and entitled "MOBILE STOCKER AND METHODS OF OPERATION." The disclosure of the prior application is considered part of and is incorporated by reference into this patent application.

BACKGROUND

A stocker is a system included in a semiconductor fabrication facility that stores transport carriers such as wafer carriers (e.g., front-opening unified pods (FOUPs)), reticle carriers, or other types of transport carriers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are diagrams of an example mobile stocker described herein for use in the example semiconductor fabrication facility of FIG. 1.

FIGS. 3A-3F, 4A, and 4B are diagrams of example implementations described herein.

DETAILED DESCRIPTION

Figure 1:
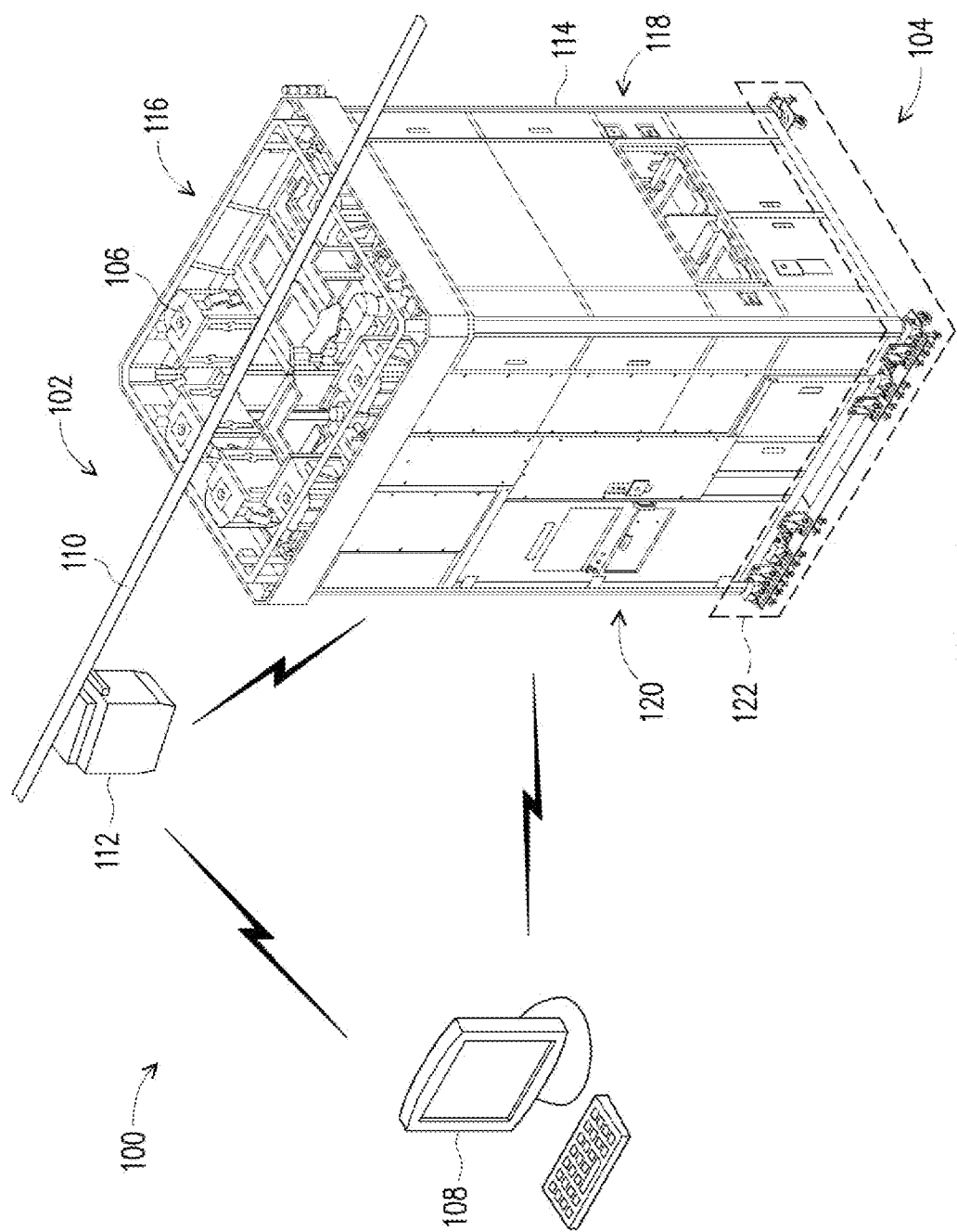
FIG. 1 is a diagram of an example semiconductor fabrication facility described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A transport carrier may be transported to or from a stocker by an overhead hoist transport (OHT) system or another type of transport system in a semiconductor fabrication facility. A stocker is a complex system that involves a complicated and time-consuming installation process, and therefore is typically fixed in a single location in a semiconductor fabrication facility. Moreover, when a stocker is relocated, other systems and components that interact with the stocker are reconfigured with the new location of the stocker, which further complicates the installation process and may result in downtime for the other systems and components.

Some implementations described herein provide a mobile stocker that is configured to be easily installed and relocated to various locations in a semiconductor fabrication facility. The mobile stocker is capable of being programmed with, and/or autonomously learning, the layout of a semiconductor fabrication facility, and automatically relocating to a new location based on the layout using a navigation system. Once relocated to the new location, the mobile stocker is capable of communicating with a material control system (MCS) to automatically set a location identifier for the mobile stocker so that an OHT system and/or another type of transport system in the semiconductor fabrication facility are enabled to load transport containers from and/or unload transport containers to the mobile stocker at the new location.

In this way, the mobile stocker is capable of being flexibly relocated in the semiconductor fabrication facility to dynamically support changes in demand and production capacity. Moreover, the capability to quickly assign a location identifier to the mobile stocker and to automatically interface with transport systems in the semiconductor fabrication facility reduces downtime of the mobile stocker, which increases productivity in the semiconductor fabrication facility.

FIG. 1 is a diagram of an example semiconductor fabrication facility 100 described herein. The semiconductor fabrication facility 100 includes a semiconductor foundry, a semiconductor clean room, a semiconductor processing facility, and/or manufacturing facility, among other examples. The semiconductor fabrication facility 100 includes various types of semiconductor processing tools that are used in the manufacturing and/or processing of semiconductor devices, such as a deposition tool (e.g., a spin-coating tool, a physical vapor deposition (PVD) tool, a chemical vapor deposition (CVD) tool), an exposure tool (e.g., an immersion lithography tool, an extreme ultraviolet (EUV) tool), a developer tool, an etch tool (e.g., a wet etch tool, a plasma etch tool), a planarization tool (e.g., a chemical mechanical planarization (CMP) tool), a plating tool (e.g., an electroplating tool), and/or another type of semiconductor processing tool.

As shown in FIG. 1, the semiconductor fabrication facility 100 includes a transport system 102, a mobile stocker 104 configured to store transport carriers 106, and a material control system (MCS) 108, in addition to the semiconductor processing tools included in the semiconductor fabrication facility 100.

The transport system 102 includes an automated material handling system (AMHS), an overhead hoist transport (OHT) system, or another type of system that is configured to transfer transport carriers 106 throughout the semiconductor fabrication facility 100. The transport carriers 106 include reticle transport carriers, wafer transport carriers (e.g., front opening unified pods (FOUPs), standard mechanical interface (SMIF) carriers, and/or other types of wafer transport carriers), and/or other types of transport carriers. The transport system 102 may include an overhead track 110 that is configured to support an OHT vehicle 112 and to permit the OHT vehicle 112 to move within the semiconductor fabrication facility 100 along the overhead track 110. The overhead track 110 may include a guided rail and/or another type of track configured to allow guides, wheels, and/or rollers of the OHT vehicle 112 to move along the overhead track 110.

The OHT vehicle 112 may include a lift that is configured to retrieve a transport carrier 106 and/or provide a transport carrier 106 to a location within the semiconductor fabrication facility 100, such as the mobile stocker 104 and/or a load port associated with a semiconductor processing tool, among other examples. The lift may include a belt system, a pulley system, a hydraulic lift, and/or another type of lifting mechanism configured to selectively load (for example, by raising) a transport carrier 106 into the OHT vehicle 112 and unload (for example, by lowering) a transport carrier 106 from the OHT vehicle 112.

The mobile stocker 104 includes storage unit 114 configured to store a plurality of transport carriers 106. The transport carriers 106 may be stored on racks, storage spaces, and/or other storage configurations in the storage unit 114. The storage unit 114 includes a plurality of rows configured to store respective subsets of transport carriers 106 and/or a plurality of columns configured to store respective subsets of transport carriers 106. The storage unit 114 may include a top opening 116 through which the mobile stocker 104 interfaces with the OHT vehicle 112 to receive and provide transport carriers 106. The storage unit 114 also includes one or more staging areas 118 through which the mobile stocker 104 interfaces with ground (or floor-based) transport tools, such as a mobile robot, an automated guided vehicle (AVG), a transport cart, and/or another type of ground transport tool. The mobile stocker 104 includes a terminal 120. The terminal 120 includes a display screen, a computation device, and/or one or more input devices through which the mobile stocker 104 is programmed, controlled, and/or maintained.

This mobile stocker 104 is mobile in that the mobile stocker 104 is configured to travel, relocate, and/or otherwise move throughout the semiconductor fabrication facility 100. In this way, the mobile stocker 104 is capable of being flexibly relocated in the semiconductor fabrication facility 100 to dynamically support changes in demand and production capacity. Accordingly, the mobile stocker 104 includes a transport system 122. The transport system 122 includes wheels, rollers, anchoring devices, and/or other components that enable the mobile stocker 104 to autonomously travel in the semiconductor fabrication facility 100.

The MCS 108 includes a device or system that is configured to analyze, control, adjust, and/or otherwise manage the transfer and flow of semiconductor substrates (or substrate lots) in the semiconductor fabrication facility 100. In some implementations, the MCS 108 is responsible for providing signals to the OHT vehicle 112 to cause the OHT vehicle 112 to retrieve transport carriers 106 from a semiconductor processing tool and/or the mobile stocker 104. In some implementations, the MCS 108 is responsible for providing signals to the OHT vehicle 112 to cause the OHT vehicle 112 to unload or provide transport carriers 106 to a semiconductor processing tool and/or the mobile stocker 104. In some implementations, the MCS 108 is responsible for providing signals to the OHT vehicle 112 to cause the OHT vehicle 112 to move transport carriers 106 between semiconductor processing tools.

The MCS 108 is also configured to control, adjust, and/or otherwise manage the operation, location, and/or movement of the mobile stocker 104. In some implementations, the MCS 108 is responsible for providing signals to the mobile stocker 104 to cause the mobile stocker 104 to move or travel to a particular location in the semiconductor fabrication facility 100. As an example, the MCS 108 may cause the mobile stocker 104 to relocate to near a semiconductor processing tool to support production at the semiconductor processing tool. In some implementations, the MCS 108 is responsible for providing signals to the mobile stocker 104 to cause the mobile stocker 104 to provide a transport carrier 106 to the OHT vehicle 112. In some implementations, the MCS 108 is responsible for providing signals to the mobile stocker 104 to cause the mobile stocker 104 to receive a transport carrier 106 from the OHT vehicle 112.

As indicated above, FIG. 1 is provided as an example. Other examples may differ from what is described with regard to FIG. 1.

Figure 2B:
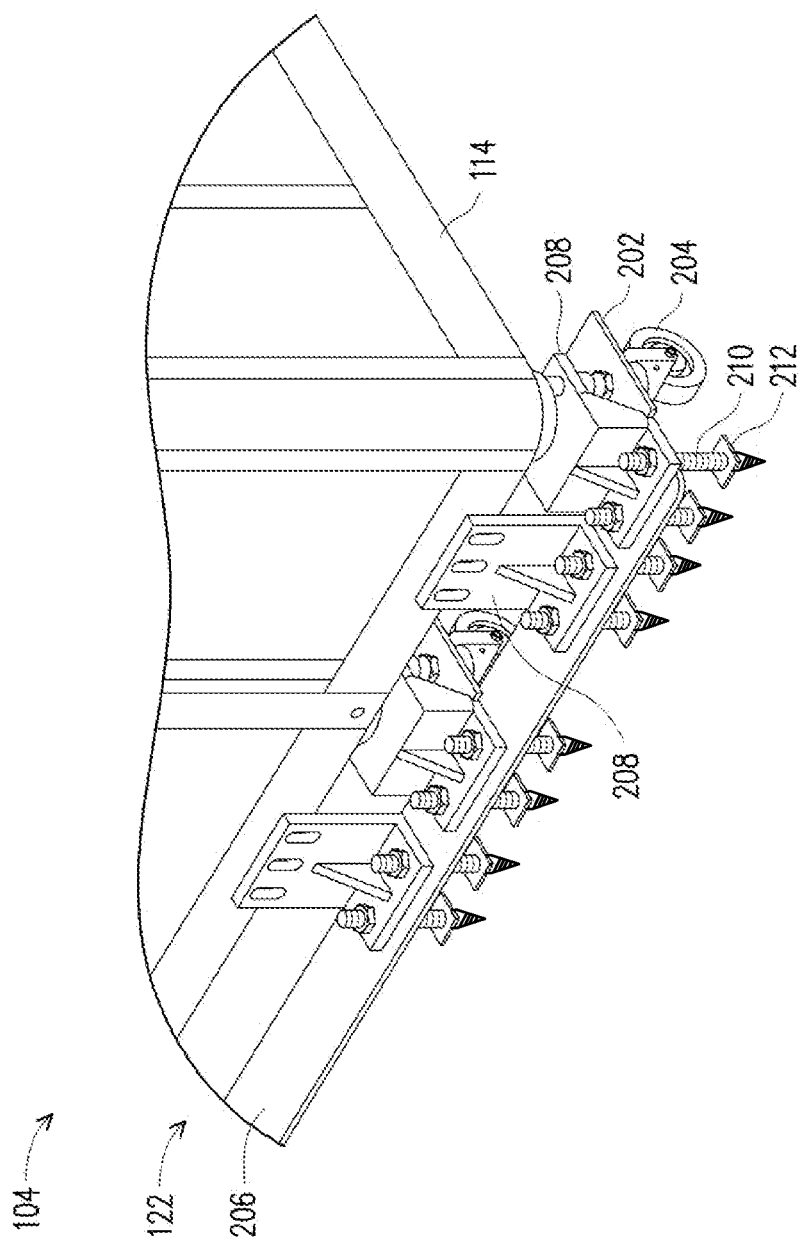

FIGS. 2A-2C are diagrams of the example mobile stocker 104 described herein for use in the example semiconductor fabrication facility 100 of FIG. 1. FIGS. 2A-2C illustrate various details of the mobile stocker 104 and/or the components of the mobile stocker 104.

FIG. 2A illustrates a plurality of dimensional parameters of the mobile stocker 104. As shown in FIG. 2A, the dimensional parameters include a height (H) of the mobile stocker 104, a length (L) of the mobile stocker 104, and a width (W) of the mobile stocker 104. The height (H), the length (L), and/or the width (W) of the mobile stocker 104 may be configured such that the mobile stocker 104 is capable of storing a particular quantity of transport carriers 106 while maintaining a relatively compact size so as to be easily movable throughout the semiconductor fabrication facility 100. As an example, the height (H) may be in a range of approximately 2 meters to approximately 3 meters, and the length (L) and the width (W) may each be in a range of approximately 1.2 meters to approximately 2.1 meters such that the mobile stocker 104 is capable of storing, for example, 30 or more transport carriers 106 while providing sufficient mobility for the mobile stocker 104. However, other values for the height (H), the length (L), and the width (W) are within the scope of the present disclosure. In some implementations, the mobile stocker 104 is configured to relocate or move within the semiconductor fabrication facility 100 while the mobile stocker 104 is loaded with transport carriers 106. In some implementations, the mobile stocker 104 is configured to relocate or move within the semiconductor fabrication facility 100 after transport carriers 106 are unloaded from the mobile stocker 104 and while the mobile stocker 104 is empty.

FIG. 2B illustrates the details of the transport system 122 of the mobile stocker 104. The transport system 122 includes a plurality of brackets 202 attached to the storage unit 114. Wheels 204 are mounted to the mobile stocker 104 on the brackets 202. The wheels 204 enable the mobile stocker 104 to move or travel throughout the semiconductor fabrication facility 100. In some implementations, the mobile stocker 104 includes four (4) wheels 204 (one wheel 204 at each corner of the storage unit 114) to enable smooth and stable movement of the mobile stocker 104. However, the mobile stocker 104 may include a greater quantity of wheels 204.

The transport system 122 includes elongated support members 206, which are attached to the storage unit 114 by a plurality of brackets 208. Securing devices are attached to and supported by the elongated support members 206. The securing devices are configured to secure the mobile stocker 104 in place to increase the stability of the mobile stocker 104 and to minimize movement of the mobile stocker 104. The securing devices include a plurality of drills 210 and a plurality of anchors 212. The drills 210 are configured to automatically drill holes into the floor of the semiconductor fabrication facility 100, and the anchors 212 are configured to automatically insert into the holes to secure the mobile stocker 104 to the floor of the semiconductor fabrication facility 100. The anchors include nuts and bolts, molly bolts, expansion anchors and screws, toggle bolts, and/or other anchor devices. In some implementations, a drill 210 and an anchor 212 are combined into a single device including a self-tapping or self-drilling anchor.

Alternatively, the drills 210 may be omitted, and the anchors 212 may be configure to attach or secure to threaded holes or latches included on the floor of the semiconductor fabrication facility 100. This reduces damage to the floor of the semiconductor fabrication facility 100 and reduces the quantity of floor panels that are periodically replaced in the semiconductor fabrication facility 100. The mobile stocker 104 may include image sensors or camera devices that is configured to scan the floor of the semiconductor fabrication facility 100 for holes or latches to which the anchors 212 can mount. Moreover, the image sensors or camera devices may be used to align the anchors 212 to the holes or latches.

FIG. 2C illustrates a schematic diagram of a control system 214 of the mobile stocker 104. The control system 214 is configured to autonomously navigate and move the mobile stocker 104 in the semiconductor fabrication facility 100, to communicate with other devices and systems in the semiconductor fabrication facility 100, and/or to perform other control functions for the mobile stocker 104. As shown in FIG. 2C, the control system 214 includes a plurality of wheel motors 216. The wheel motors 216 include electric motors, brushed or brushless motors, and/or other types of wheel motors that are configured to generate movement of the mobile stocker 104 by causing the wheels 204 to rotate. In some implementations, the wheel motors 216 are also responsible for steering the movement of the mobile stocker 104 in that one or more wheel motors 216 may rotate associated wheels 204 at different rotational speeds relative to other wheels 204 to turn or steer the mobile stocker 104.

As further shown in FIG. 2C, the control system 214 includes a navigation system 218 that is configured to autonomously navigate the mobile stocker 104 in the semiconductor fabrication facility 100. The navigation system 218 includes one or more navigation devices 220a-220n and one or more sensors 222a-222m. The navigation system 218 uses the one or more navigation devices 220a-220n and the one or more sensors 222a-222m to generate a navigation map of the semiconductor fabrication facility 100 and to autonomously navigate the mobile stocker 104 in the semiconductor fabrication facility 100 based on the navigation map. The navigation map may include information identifying the walkways, semiconductor processing tools and other equipment, pathways of travel of other autonomous equipment in the semiconductor fabrication facility 100, and/or other mapping information for the semiconductor fabrication facility 100.

In some implementations, the navigation system 218 uses a map generation technique, such as simultaneous localization and mapping (SLAM) and/or another map generation technique, to generate the navigation map. In these implementations, the navigation system 218 generates the navigation map as the mobile stocker 104 travels throughout the semiconductor fabrication facility 100. The one or more navigation devices 220a-220n generate sensor data as the mobile stocker 104 travels throughout the semiconductor fabrication facility 100, and the navigation system 218 uses the sensor data to generate the navigation map. The one or more navigation devices 220a-220n include a time of flight (ToF) sensor configured to generate ToF data (e.g., for detecting how close objects are to the mobile stocker 104), a lidar sensor configured to generate three-dimensional laser scanning data, a radar sensor configured to generate radar data, a camera sensor configured to generate images and/or video of the semiconductor fabrication facility 100, a proximity sensor configured to generate proximity data, an inertial sensor configured to generate inertia data, and/or another type of sensor.

The one or more navigation devices 220a-220n include a global positioning sensor (GPS) device, a wireless station calibration device, a quick response (QR) code reader device, a SLAM device, a compass device, and/or another type of navigation device. The navigation system 218 may use the one or more navigation devices 220a-220n to identify a path of travel from a first location to a second location in the semiconductor fabrication facility 100 based on the navigation map using various routing techniques. The routing techniques include shortest path routing, shortest travel time routing, and/or another routing technique. The navigation system 218 may use the one or more navigation devices 220a-220n to identify a path of travel based on the paths of travel of other autonomous equipment in the semiconductor fabrication facility 100 to prevent collisions between the mobile stocker 104 and the other autonomous equipment. In some implementations, the mobile stocker 104 communicates with the MCS 108 to obtain initial navigation information for navigating to a particular location in the semiconductor fabrication facility 100, such as an unknown or undiscovered location for the mobile stocker 104. In these implementations, the MCS 108 may provide the mobile stocker 104 with information identifying GPS coordinates associated with the unknown or undiscovered location, information identifying another location near the unknown or undiscovered location and directions or a distance from the other location and the unknown or undiscovered location, and/or other information.

The control system 224 includes a controller 224 configured to receive information from the navigation system 218 (and/or the one or more navigation devices 220a-220n and the one or more sensors (222a-222m) and provide instructions to cause one or more other devices and/or components to perform various actions, among other examples. As an example, the controller 224 may provide signals to the wheel motors 216 to cause the mobile stocker to autonomously travel throughout the semiconductor fabrication facility 100. As another example, the controller 224 may provide signals to the transport system 122 to cause the drills 210 to drill holes in the floor of the semiconductor fabrication facility 100 and/or to cause the anchors 212 to deploy or retract.

The control system 224 includes a plurality of wired and/or wireless communication interfaces that are configured to communicate with various devices and systems in the semiconductor fabrication facility 100. A communication interface 226 includes a wired or wireless interface configured to communicate with the MCS 108. As an example, the communication interface 226 may include a Wi-Fi interface, a cellular interface, an Ethernet interface, and/or another type of communication interface. A communication interface 228 includes a wired or wireless interface configured to communicate with the OHT system 102. As an example, the communication interface 228 includes an E84 interface, a Wi-Fi interface, and/or another type of communication interface.

As indicated above, FIGS. 2A-2C are provided as an example. Other examples may differ from what is described with regard to FIGS. 2A-2C.

FIGS. 3A-3F are diagrams of an example implementation 300 described herein. The example implementation 300 includes an example process of operations to relocate the mobile stocker 104 in the semiconductor fabrication facility 100.

Figure 3A:
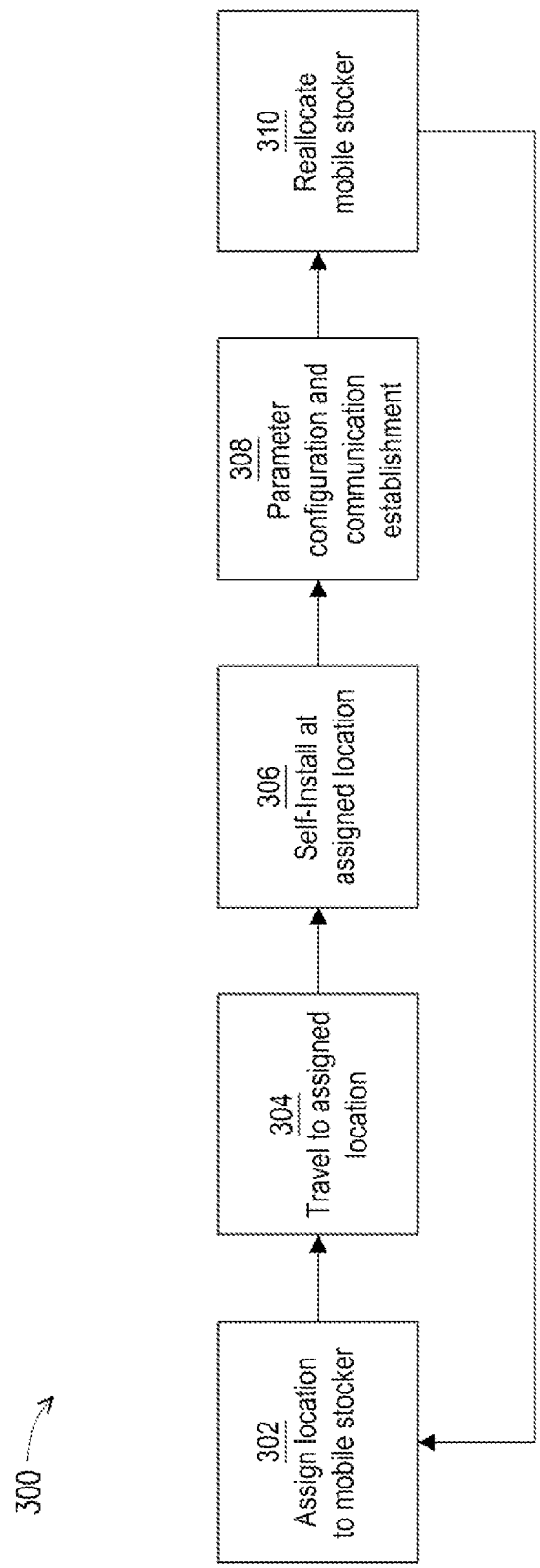

FIG. 3A illustrates a process flow of the example implementation 300. As shown in FIG. 3A, a location is assigned to the mobile stocker 104 to relocate the mobile stocker 104 (block 302). The mobile stocker 104 autonomously travels to the assigned location (e.g., based on being assigned to the location by the MCS 108) (block 304). Once the mobile stocker 104 arrives at the assigned location, the mobile stocker 104 self-installs at the assigned location (block 306). Parameters are configured and communication is established for the mobile stocker 104 at the assigned location with other devices and systems in the semiconductor fabrication facility 100 (block 308). Then, transport carriers 106 are retrieved from and/or provided to the mobile stocker 104 at the assigned location. Subsequently, the mobile stocker 104 may be reallocated to another location in the semiconductor fabrication facility 100 (block 310), which may include performing one or more of the operations described in connection with blocks 302-308.

As shown in FIG. 3B, the MCS 108 may transmit a communication to the mobile stocker 104 to assign the location to the mobile stocker 104 (block 302). The MCS 108 may transmit the communication over a wireless connection and/or a wired connection to the mobile stocker 104. The mobile stocker 104 receives the communication from the MCS 108 using the communication interface 226. In some implementations, the communication includes a location identifier associated with the location to which the mobile stocker 104 is to be reallocated and an instruction to travel or relocate to the location associated with the location identifier. In some implementations, the communication includes a location identifier, and the mobile stocker 104 determines or identifies the location based on the location identifier.

The MCS 108 transmits the communication based on determining to reallocate the mobile stocker 104, based on receiving input indicating that the mobile stocker 104 is to be reallocated to a new location, based on receiving (e.g., from the mobile stocker 104, from a semiconductor processing tool, among other examples) a request to be reallocated to another location, and/or based on another factor.

In some implementations, the MCS 108 determines to reallocate the mobile stocker 104 based on production demand associated with one or more semiconductor processing tools in the semiconductor fabrication facility 100. As an example, the MCS 108 may determine to reallocate the mobile stocker 104 to a location near a semiconductor processing tool that is experiencing high utilization to provide additional throughput of transport carriers 106 for the semiconductor processing tool. In this way, the transport carriers 106 may be transported to the mobile stocker 104 in a quicker and more efficient manner, which may enable the semiconductor processing tool to continue to process additional semiconductor substrates with minimal delays.

In some implementations, the MCS 108 determines to reallocate the mobile stocker 104 based on a production schedule or a process flow for semiconductor substrates stored in transport carriers 106 that are stored in the mobile stocker 104. As an example, the MCS 108 may determine to reallocate the mobile stocker 104 to a location near a semiconductor processing tool that is scheduled to process a large percentage (e.g., 50%, 75%, or another percentage) of the semiconductor substrates stored in the transport carriers 106 stored by the mobile stocker 104.

In some implementations, the MCS 108 determines to reallocate the mobile stocker 104 based on downtime of another mobile stocker (or non-mobile stocker), or based on scheduled and/or unscheduled maintenance of the other mobile stocker (or non-mobile stocker), so that the mobile stocker 104 fills in for the other mobile stocker (or non-mobile stocker). In this way, scheduling and production impacts may be minimized. In some implementations, the MCS 108 determines to reallocate the mobile stocker 104 for other purposes and/or based on other factors.

Figure 3C:
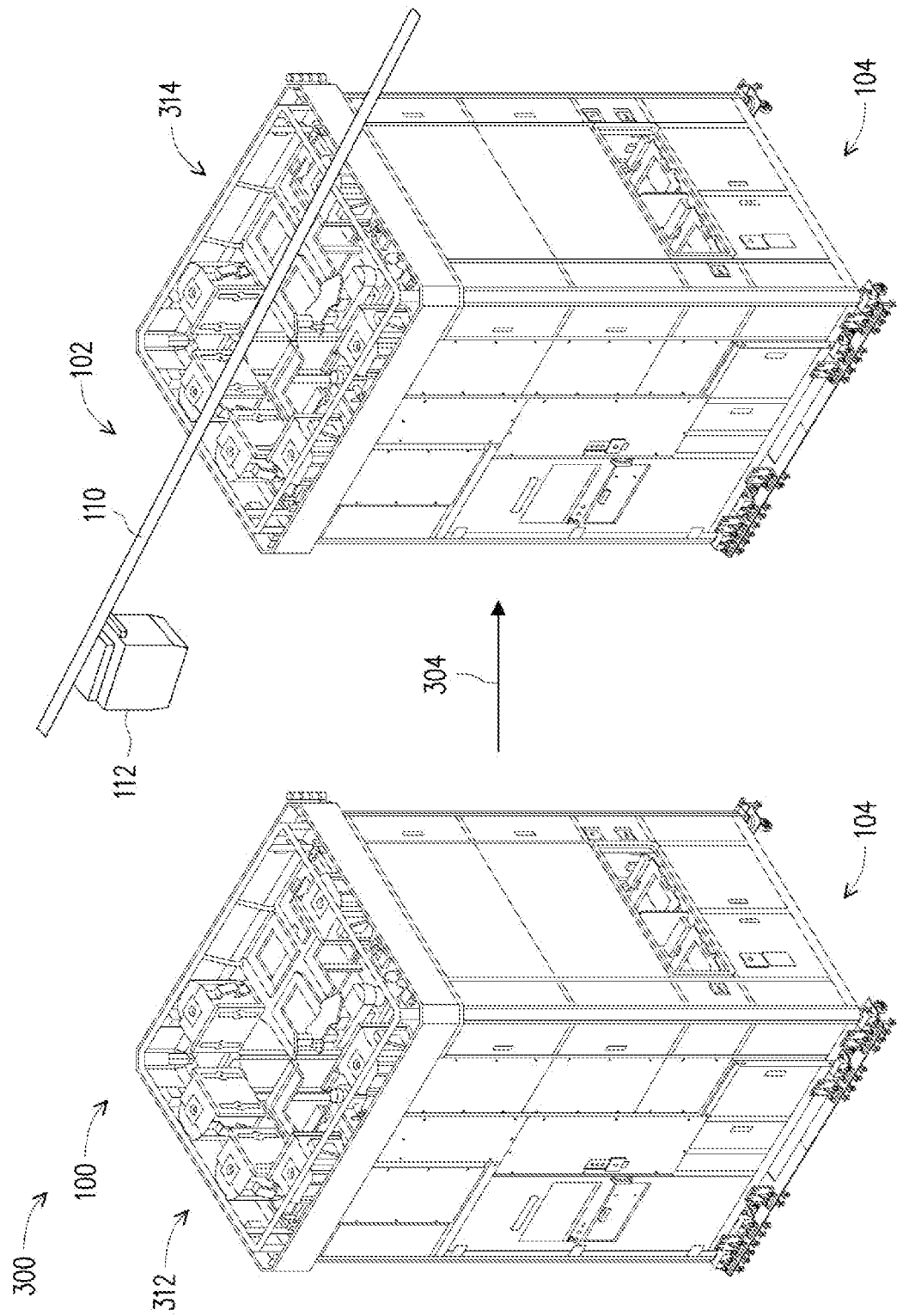

As shown in FIG. 3C, the mobile stocker 104 autonomously travels or moves from a location 312 to a location 314 based on the communication from the MCS 108 (block 304). The mobile stocker 104 moves to the location 314 on the wheels 204, which are driven by the wheel motor(s) 216. The controller 224 controls the wheel motor(s) 216 to steer the mobile stocker 104 through the semiconductor fabrication facility 100 to the location 314. The controller 224 may use sensor data from the sensor(s) 222a-222m to steer the mobile stocker 104 to avoid and navigate around obstacles and/or to prevent the mobile stocker 104 from colliding with other equipment and personnel in the semiconductor fabrication facility 100.

Moreover, the controller 224 may control the wheel motor(s) 216 to steer the mobile stocker 104 through the semiconductor fabrication facility 100 to the location 314 based on a navigation map of the semiconductor fabrication facility 100. The navigation map may be generated by the navigation system 218 (e.g., using the navigation device(s) 220a-220n and/or the sensors 222a-222m), may be provided to the mobile stocker 104 by the MCS 108, or a combination thereof. In these implementations, the navigation system 218 provides navigation inputs to the controller 224 to autonomously navigate the mobile stocker 104 from the location 312 to the location 314 based on the navigation map.

The navigation system 218 may determine, using the navigation map, a path of travel from the location 312 to the location 314 based on the location address associated with the location 314. In some implementations, the location address may be provided by the MCS 108. In some implementations, the controller 224 or the navigation system 218 determines the location address based on the location identifier provided by the MCS 108. In some implementations, the controller 224 or the navigation system 218 determines the location address based other information identified in the communication from the MCS 108. As an example, the communication from the MCS 108 may indicate that the mobile stocker 104 is to relocate to near a particular semiconductor processing tool, and the controller 224 or the navigation system 218 determines the location 314 (and the associated location address) based on the location 314 being near the particular semiconductor processing tool and under the overhead track 110. In this way, the controller 224 or the navigation system 218 determines the location 314 such that the mobile stocker 104 will be near the particular semiconductor processing tool and accessible by the OHT vehicle 112 at the location 314.

Additionally or alternatively to receiving the communication from the MCS 108 to reallocate the mobile stocker 104, the controller 224 causes the mobile stocker to autonomously travel to the location 314 based on a navigation schedule (or a production schedule). The navigation schedule may be received from the MCS 108, may be programmed at the mobile stocker 104, and/or may be received by the mobile stocker 104 from another device. The navigation schedule identifies a sequence of locations in the semiconductor fabrication facility 100 to which the mobile stocker 104 is to travel. Moreover, the navigation schedule identifies the times that the mobile stocker 104 is to relocate to each location in the sequence of locations. Accordingly, the controller 224 may autonomously determine to relocate the mobile stocker 104 from the location 312 to the location 314 at a specified time based on determining that the location 314 is the next location in the sequence of locations in the navigation schedule.

Figure 3D:
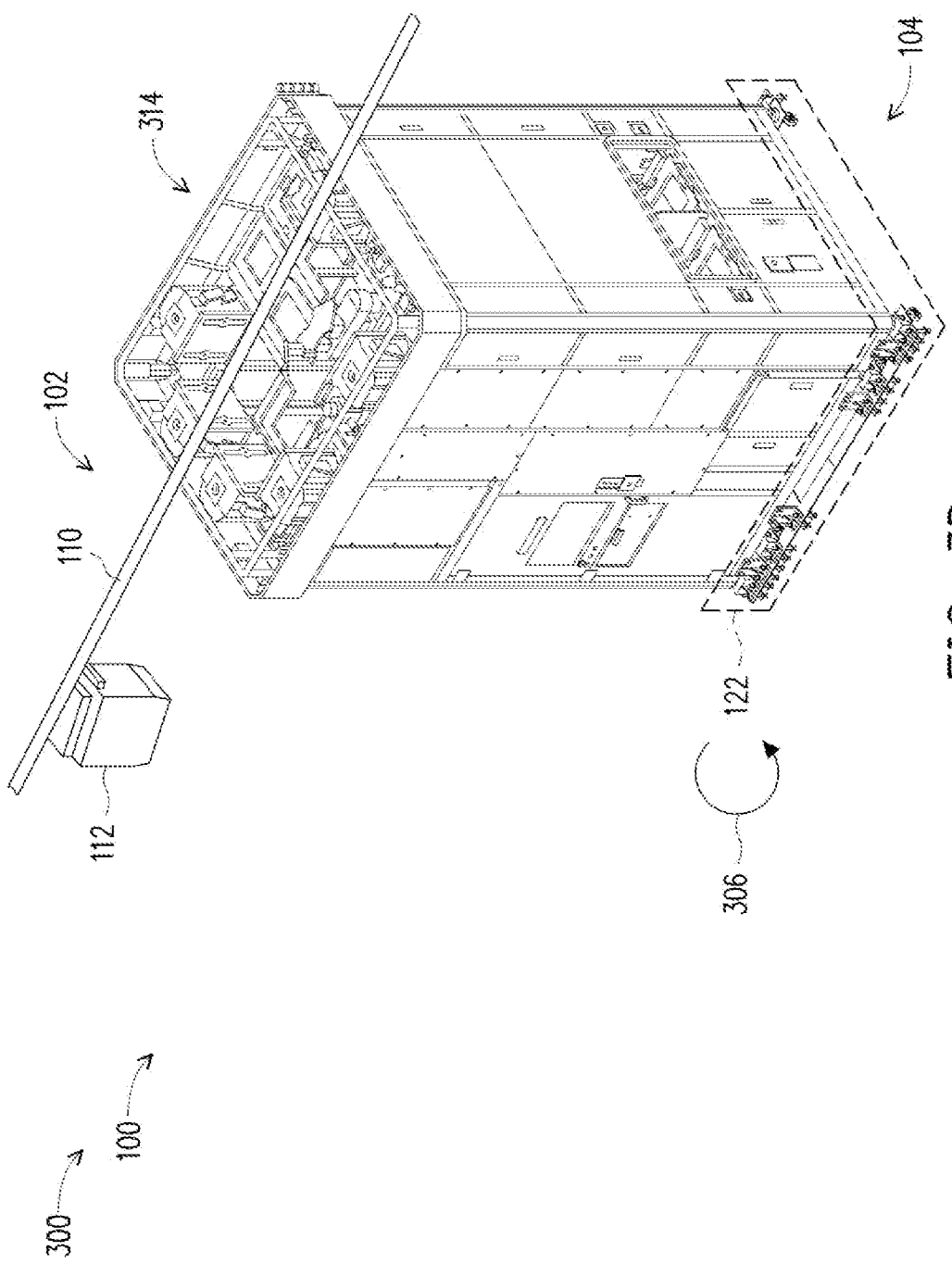

As shown in FIG. 3D, the mobile stocker 104 arrives at the location 314 and self-installs at the location 314 (block 306). The self-installation process includes deploying one or more securing devices to anchor the mobile stocker 104 to the floor of the semiconductor fabrication facility 100 at the location 314. The mobile stocker 104 is secured in place at the location 314 to prevent the mobile stocker 104 from moving, tipping, and/or otherwise becoming unstable. In some implementations, the controller 224 communicates with the transport system 122 to cause the drills 210 to drill holes into the floor of the semiconductor fabrication facility 100, and to cause the anchors 212 to be inserted into the holes in the floor to secure the mobile stocker 104 in place. In some implementations, the controller 224 communicates with the transport system 122 to cause the anchors 212 to be inserted into holes that were pre-drilled in the floor of the semiconductor fabrication facility 100.

In some implementations, the anchors 212 raise or lift the wheels 204 of the mobile stocker 104 off of the floor of the semiconductor fabrication facility 100 to prevent the mobile stocker 104 from moving on the wheels 204. In some implementations, the wheels 204 are retracted such that the mobile stocker 104 is supported by the anchors 212 to prevent the mobile stocker 104 from moving on the wheels 204.

Figure 3E:
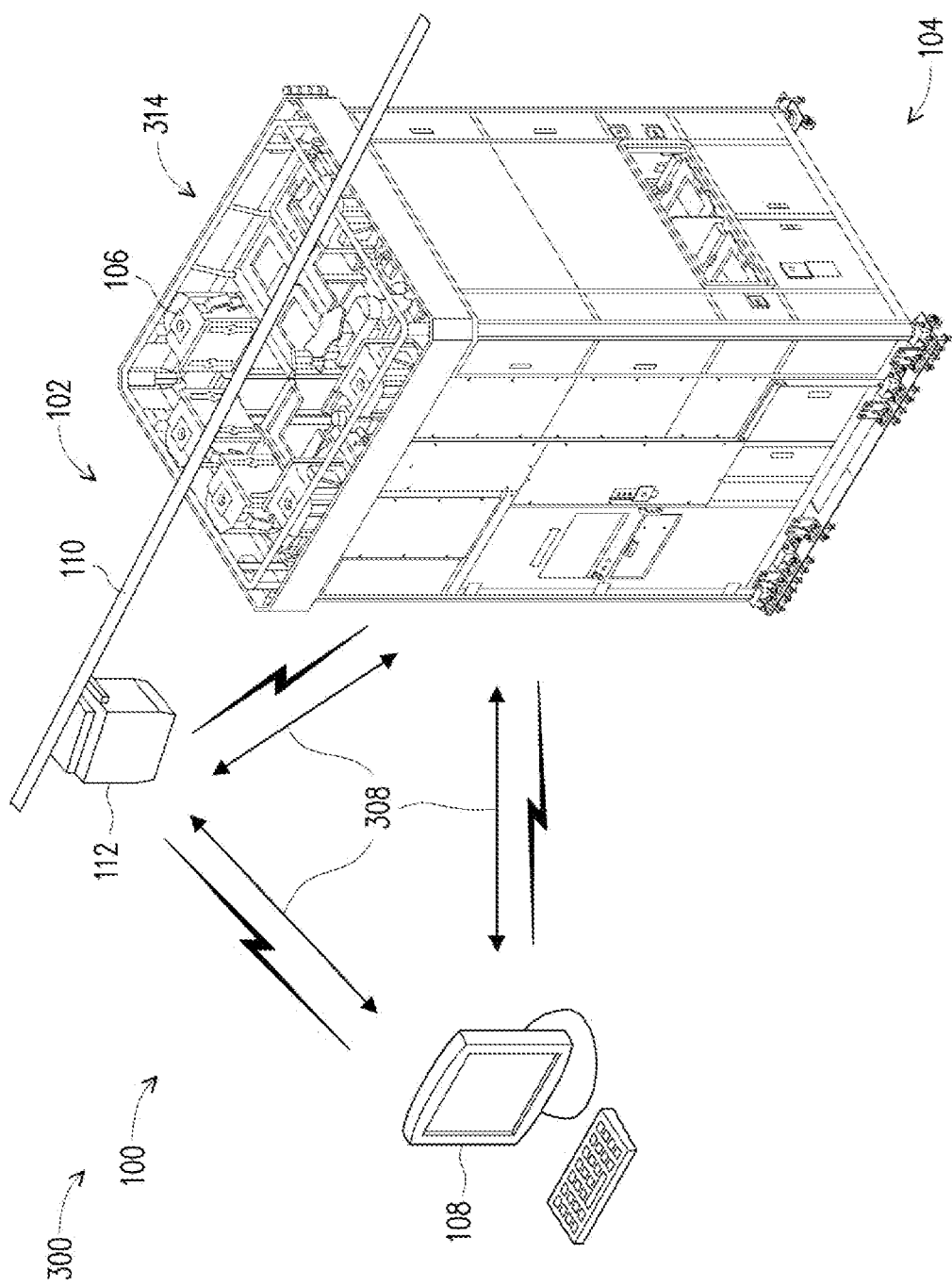

As shown in FIG. 3E, the mobile stocker 104, the MCS 108, and the transport system 102 may establish communication connections and may communicate to configure one or more parameters for the mobile stocker 104 (block 308). The mobile stocker 104 may maintain the communication connection with the MCS 108 or may establish a new communication connection with the MCS 108 once at the location 314 (e.g., using the communication interface 226). The communication connection with the MCS 108 may include a wireless communication connection and/or a wired communication connection. In implementations in which the communication connection with the MCS 108 is a wired communication connection, the mobile stocker 104 may automatically establish the physical connection of the wired communication connection (e.g., may automatically insert a networking cable into a networking port) or the wired communication connection may be manually established.

The transport system 102 and the mobile stocker 104 may establish a wireless communication connection (e.g., using the communication interface 228) by performing a handshake procedure. The handshake procedure includes an E84 handshake procedure or another type of communication establishment handshake procedure in which handshake signals for use in a parallel input/output interface are used to automate transport carrier delivery and transport carrier removal. In some implementations, the handshake procedure is performed by the transport system 102 and the mobile stocker 104 for each transport carrier delivery or transport carrier removal operation. In some implementations, the handshake procedure is performed by the transport system 102 and the mobile stocker 104 for the exchange of a plurality of transport carriers 106.

In some implementations, the mobile stocker 104 transmits (e.g., using the communication interface 226) a communication to the MCS 108 to indicate that the mobile stocker 104 has arrived and is secured at the location 314. In some implementations, the mobile stocker 104 transmits (e.g., using the communication interface 226 and/or the communication interface 228) a communication to the MCS 108 and/or to the transport system 102 to indicate the one or more parameters for the mobile stocker 104. Additionally or alternatively, the MCS 108, the mobile stocker 104, and the OHT vehicle 112 negotiate the one or more parameters for the mobile stocker 104. The one or more parameters include one or more parameters to facilitate providing and/or receiving transport carriers 106 at the location 314, including the location identifier, a load port identifier, and an unload port identifier, among other examples.

The load port identifier includes an identifier, associated with the mobile stocker 104, that is used for indicating that a load operation is to be performed in connection with the mobile stocker 104. For example, the MCS 108 may use the load port identifier to indicate that the OHT vehicle 112 is to load a transport carrier 106 from the mobile stocker 104 (e.g., to a load port of the mobile stocker 104) at the location 314. The unload port identifier includes an identifier, associated with the mobile stocker 104, that is used for indicating that an unload operation is to be performed in connection with the mobile stocker 104. For example, the MCS 108 may use the unload port identifier to indicate that the OHT vehicle 112 is to unload a transport carrier 106 to the mobile stocker 104 (e.g., to an unload port of the mobile stocker 104) at the location 314.

Once the communication connections have been established and the one or more parameters for the mobile stocker 104 have been configured, the mobile stocker 104 may be accessed by the transport system 102 at the location 314. In some implementations, the MCS 108 transmits, to the OHT vehicle 112, the location identifier associated with the location 314 and an instruction to unload a transport carrier 106 to the mobile stocker 104 (e.g., through the top opening 116) at the location 314. In these implementations, the instruction may indicate the unload port identifier associated with the mobile stocker 104. In some implementations, the MCS 108 transmits, to the OHT vehicle 112, the location identifier associated with the location 314 and an instruction to retrieve a transport carrier 106 from the mobile stocker 104 (e.g., through the top opening 116) at the location 314. In these implementations, the instruction may indicate the load port identifier associated with the mobile stocker 104.

As shown in FIG. 3F, the MCS 108 may transmit a communication to the mobile stocker 104 at the location 314 to reallocate the mobile stocker 104 to another location (block 310). The MCS 108 and the mobile stocker 104 may perform one or more of the operations described in connection with blocks 302-308 to reallocate the mobile stocker 104 to the other location.

As indicated above, FIGS. 3A-3F are provided as an example. Other examples may differ from what is described with regard to FIGS. 3A-3F.

Figure 4B:
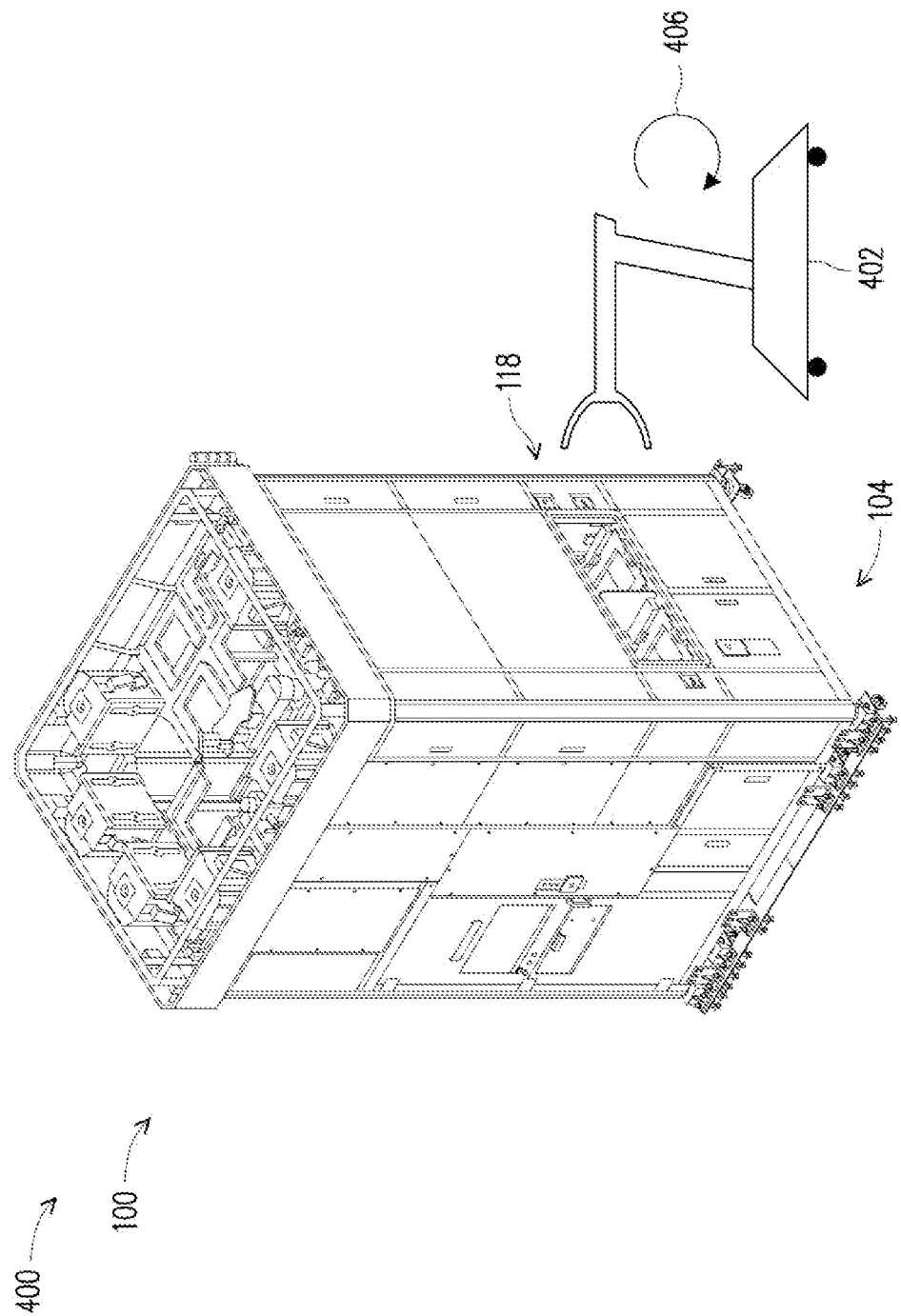

FIGS. 4A and 4B are diagrams of an example implementation 400 described herein. As shown in FIGS. 4A and 4B, the example implementation 400 includes an example process of operations to access the mobile stocker 104 in the semiconductor fabrication facility 100 using a mobile transport tool 402. In some implementations, one or more of the operations of the example implementation 300 may be performed in connection with the example implementation 400 to relocate the mobile stocker 104 prior to and/or after the mobile transport tool 402 accesses the mobile stocker 104.

The mobile transport tool 402 includes a ground-based transport tool that is capable of automatically and/or autonomously traveling along the floor of the semiconductor fabrication facility 100. The mobile transport tool 402 includes an AVG, a mobile robot, and/or a similar type of mobile transport tool.

As shown in FIG. 4A, the MCS 108 may transmit a communication 404 to the mobile transport tool 402. The communication indicates the location identifier associated with the location of the mobile stocker 104. The communication further indicates an instruction to unload a transport carrier 106 to the staging area 118 of the mobile stocker at the location or to retrieve a transport carrier 106 from the staging area 118 at the location.

As shown in FIG. 4B, the mobile transport tool 402 travels to the location of the mobile stocker 104 based on the location identifier. As shown by reference number 406, the mobile transport tool 402 may access the mobile stocker 104 through the staging area 118 to retrieve a transport carrier 106 from the mobile stocker 104 and/or to provide a transport carrier 106 to the mobile stocker 104.

As indicated above, FIGS. 4A and 4B are provided as an example. Other examples may differ from what is described with regard to FIGS. 4A and 4B.

Figure 5:
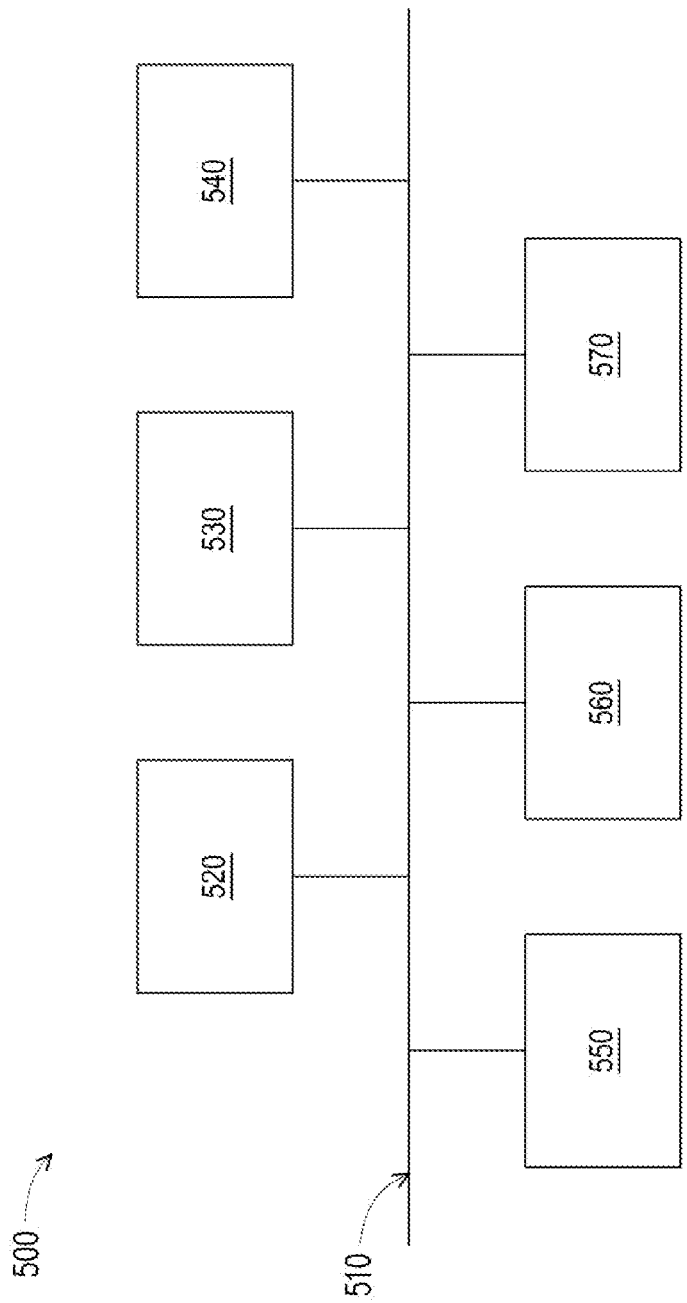
FIG. 5 is a diagram of example components of one or more devices of FIG. 1.

FIG. 5 is a diagram of example components of a device 500, which may correspond to the MCS 108, the OHT vehicle 112, the control system 214 of the mobile stocker 104, the wheel motors 216, the navigation system 218, the navigation device(s) 220a-220n, the sensor(s) 222a-222m, the controller 224, and/or another device described herein. In some implementations, the MCS 108, the OHT vehicle 112, the control system 214 of the mobile stocker 104, the wheel motors 216, the navigation system 218, the navigation device(s) 220a-220n, the sensor(s) 222a-222m, the controller 224, and/or another device described herein may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
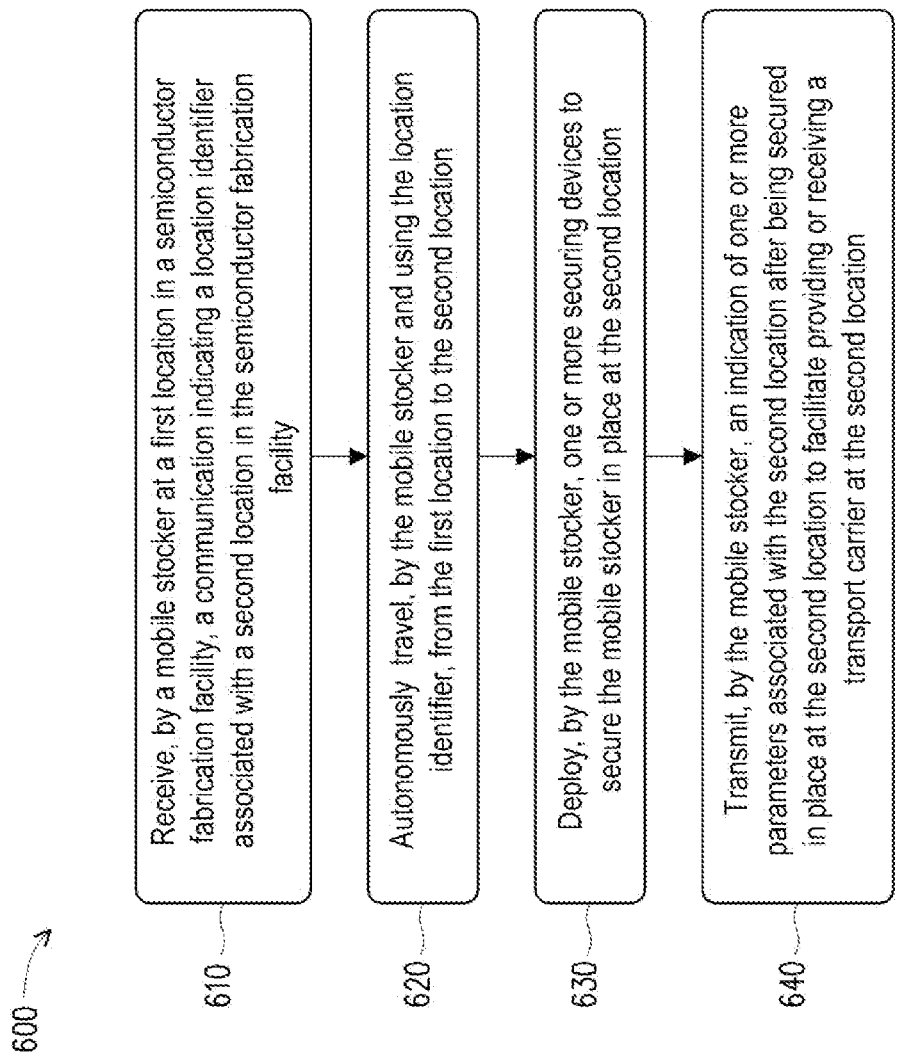
FIGS. 6 and 7 are flowcharts of example processes relating to mobile stocker operation.

FIG. 6 is a flowchart of an example process 600 associated with mobile stocker operation. In some implementations, one or more process blocks of FIG. 6 may be performed by a mobile stocker (e.g., the mobile stocker 104). In some implementations, one or more process blocks of FIG. 6 may be performed by another device or a group of devices separate from or including the mobile stocker, such as a transport system (e.g., the transport system 102) and/or an MCS (e.g., the MCS 108), among other examples. Additionally, or alternatively, one or more process blocks of FIG. 6 may be performed by one or more components of device 500, such as processor 520, memory 530, storage component 540, input component 550, output component 560, and/or communication component 570. In some implementations, one or more operations described in connection the process 600 may be performed in connection with the example implementation 300 described above.

As shown in FIG. 6, process 600 may include receiving a communication indicating a location identifier associated with a second location in the semiconductor fabrication facility (block 610). For example, the mobile stocker 104, located at a first location 312, may receive the communication indicating a location identifier associated with the second location 314 in the semiconductor fabrication facility 100, as described above.

As further shown in FIG. 6, process 600 may include autonomously traveling, using the location identifier, from the first location to the second location (block 620). For example, the mobile stocker 104 may autonomously travel, using the location identifier, from the first location 312 to the second location 314, as described above.

As further shown in FIG. 6, process 600 may include deploying one or more securing devices to secure the mobile stocker in place at the second location (block 630). For example, the mobile stocker 104 may deploy one or more securing devices (e.g., the drills 210, the anchors 212) to secure the mobile stocker 104 in place at the second location 314, as described above.

As further shown in FIG. 6, process 600 may include transmitting an indication of one or more parameters associated with the second location after being secured in place at the second location to facilitate providing or receiving a transport carrier at the second location (block 640). For example, the mobile stocker 104 may transmit an indication of one or more parameters associated with the second location 314 after being secured in place at the second location to facilitate providing or receiving a transport carrier (106) at the second location, as described above.

Process 600 may include additional implementations, such as any single implementation or any combination of implementations described below and/or in connection with one or more other processes described elsewhere herein.

In a first implementation, transmitting the indication of the one or more parameters includes transmitting the indication of the one or more parameters to at least one of the MCS 108 or the Transport system 102. In a second implementation, alone or in combination with the first implementation, the one or more parameters include at least one of a load port identifier, an unload port identifier, or a location identifier. In a third implementation, alone or in combination with one or more of the first and second implementations, process 600 includes generating a navigation map of the semiconductor fabrication facility 100, and autonomously traveling to the second location 314 using the navigation map.

In a fourth implementation, alone or in combination with one or more of the first through third implementations, generating the navigation map includes generating the navigation map using a SLAM technique. In a fifth implementation, alone or in combination with one or more of the first through fourth implementations, process 600 includes receiving, from the MCS 108, a navigation schedule that identifies a sequence of locations in the semiconductor fabrication facility 100, where the first location and the second location are included in the sequence of locations, and traveling from the first location to the second location includes autonomously traveling from the first location to the second location based on the navigation schedule.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
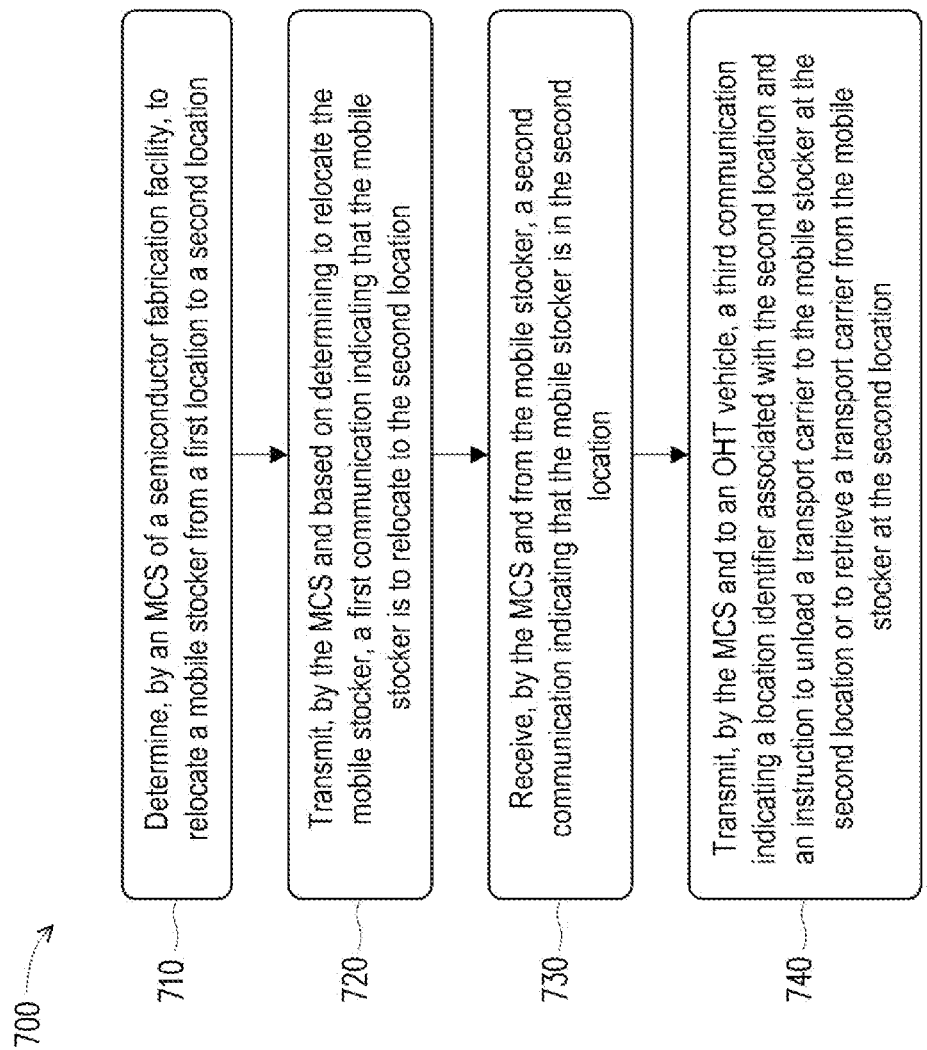

FIG. 7 is a flowchart of an example process 700 associated with mobile stocker operation. In some implementations, one or more process blocks of FIG. 7 may be performed by an MCS (e.g., the MCS 108). In some implementations, one or more process blocks of FIG. 7 may be performed by another device or a group of devices separate from or including the MCS, such as a transport system (e.g., the transport system 102) and/or a mobile stocker (e.g., the mobile stocker 104), among other examples. Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include determining to relocate a mobile stocker from a first location to a second location (block 710). For example, the MCS 108 may determine to relocate the mobile stocker 104 from the first location 312 to the second location 314, as described above.

As further shown in FIG. 7, process 700 may include transmitting, based on determining to relocate the mobile stocker, a first communication indicating that the mobile stocker is to relocate to the second location (block 720). For example, the MCS 108 may transmit, based on determining to relocate the mobile stocker 104, a first communication indicating that the mobile stocker 104 is to relocate to the second location 314, as described above.

As further shown in FIG. 7, process 700 may include receiving, from the mobile stocker, a second communication indicating that the mobile stocker is in the second location (block 730). For example, the MCS 108 may receive, from the mobile stocker 104, a second communication indicating that the mobile stocker 104 is in the second location 314, as described above.

As further shown in FIG. 7, process 700 may include transmitting, to an OHT vehicle, a third communication indicating a location identifier associated with the second location and an instruction to unload a transport carrier to the mobile stocker at the second location or to retrieve a transport carrier from the mobile stocker at the second location (block 740). For example, the MCS 108 may transmit, to the OHT vehicle 112, a third communication indicating a location identifier associated with the second location 314 and an instruction to unload a transport carrier 106 to the mobile stocker 104 at the second location or to retrieve a transport carrier 106 from the mobile stocker 104 at the second location 314, as described above.

Process 700 may include additional implementations, such as any single implementation or any combination of implementations described below and/or in connection with one or more other processes described elsewhere herein.

In a first implementation, determining to relocate the mobile stocker 104 from the first location 312 to the second location 314 includes determining, based on production demand for a semiconductor processing tool at the second location 314, to relocate the mobile stocker 104 from the first location 312 to the second location 314 to support the production demand for the semiconductor processing tool. In a second implementation, alone or in combination with the first implementation, process 700 includes transmitting, to a mobile robot (e.g., the mobile transport tool 402), a fourth communication (e.g., the communication 404) indicating the location identifier and an instruction to unload a transport carrier 106 to the staging area 118 of the mobile stocker at the second location 314 or to retrieve a transport carrier 106 from the staging area 118 at the second location 314.

In a third implementation, alone or in combination with one or more of the first and second implementations, the third communication indicates the instruction to unload the transport carrier 106 to the mobile stocker 104 at the second location 314, and the third communication further indicates an unload port identifier associated with an unload port to which the transport carrier 106 is to be unloaded. In a fourth implementation, alone or in combination with one or more of the first through third implementations, the third communication indicates the instruction to load the transport carrier 106 from the mobile stocker 104 at the second location 314, and the third communication further indicates a load port identifier associated with a load port from which the transport carrier 106 is to be loaded.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, the mobile stocker described herein is configured to be easily installed and relocated to various locations in a semiconductor fabrication facility. The mobile stocker is capable of being programmed with, and/or autonomously learning, the layout of a semiconductor fabrication facility, and automatically relocating to a new location based on the layout using a navigation system. Accordingly, the mobile stocker is capable of being flexibly relocated in the semiconductor fabrication facility to dynamically support changes in demand and production capacity. Moreover, the capability to quickly assign a location identifier to the mobile stocker and to automatically interface with transport systems in the semiconductor fabrication facility reduces downtime of the mobile stocker, which increases productivity in the semiconductor fabrication facility.

As described in greater detail above, some implementations described herein provide a mobile stocker. The mobile stocker includes a storage unit configured to store a plurality of transport carriers. The storage unit includes at least one of a plurality of rows configured to store respective subsets of the plurality of transport carriers or a plurality of columns configured to store respective subsets of the plurality of transport carriers.

The mobile stocker includes a plurality of wheels, at a bottom of the storage unit, configured to permit the mobile stocker to be moved. The mobile stocker includes a navigation system configured to autonomously navigate the mobile stocker in a semiconductor fabrication facility.

As described in greater detail above, some implementations described herein provide a method. The method includes receiving, by a mobile stocker at a first location in a semiconductor fabrication facility, a communication indicating a location identifier associated with a second location in the semiconductor fabrication facility. The method includes autonomously traveling, by the mobile stocker and using the location identifier, from the first location to the second location. The method includes deploying, by the mobile stocker, one or more securing devices to secure the mobile stocker in place at the second location. The method includes transmitting, by the mobile stocker, an indication of one or more parameters associated with the second location after being secured in place at the second location to facilitate providing or receiving a transport carrier at the second location.

As described in greater detail above, some implementations described herein provide a method. The method includes determining, by an MCS of a semiconductor fabrication facility, to relocate a mobile stocker from a first location to a second location. The method includes transmitting, by the MCS and based on determining to relocate the mobile stocker, a first communication indicating that the mobile stocker is to relocate to the second location. The method includes receiving, by the MCS and from the mobile stocker, a second communication indicating that the mobile stocker is in the second location. The method includes transmitting, by the MCS and to an OHT vehicle, a third communication indicating, a location identifier associated with the second location, and an instruction to unload a transport carrier to the mobile stocker at the second location or to retrieve a transport carrier from the mobile stocker at the second location.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mobile stocker, comprising:
    a storage unit configured to store a plurality of transport carriers,
        wherein the storage unit includes at least one of:
            a plurality of rows configured to store respective subsets of the plurality of transport carriers, or
            a plurality of columns configured to store respective subsets of the plurality of transport carriers;
    a plurality of wheels, at a bottom of the storage unit, configured to permit the mobile stocker to be moved in a semiconductor fabrication facility;
    one or more anchors configured to attach or secure to holes in, or latches on, a floor of the semiconductor fabrication facility; and
    a navigation system configured to autonomously navigate the mobile stocker in the semiconductor fabrication facility.

2. The mobile stocker of claim 1, wherein the navigation system comprises one or more navigation devices including at least one of:
    a global positioning system (GPS) device,
    a wireless station calibration device,
    a quick response (QR) code reader device, or
    a simultaneous localization and mapping (SLAM) device.

3. The mobile stocker of claim 1, wherein the navigation system comprises one or more sensors including at least one of:
    a camera sensor,
    an inertial sensor,
    a lidar sensor, or
    a proximity sensor.

4. The mobile stocker of claim 1, wherein the one or more anchors are further configured to raise the storage unit off of the floor of the semiconductor fabrication facility such that the plurality of wheels does not contact the floor.

5. The mobile stocker of claim 4, further comprising:
    one or more drills configured to drill the holes into the floor of the semiconductor fabrication facility for attaching or securing the one or more anchors.

6. The mobile stocker of claim 1, further comprising:
    a first communication interface configured to communicate with a material control system (MCS).

7. The mobile stocker of claim 6, wherein the first communication interface is configured to:
    receive, from the MCS, a location address associated with a location in the semiconductor fabrication facility; and
    wherein the navigation system is configured to:
        autonomously navigate, based on the location address, the mobile stocker to the location on the plurality of wheels.

8. The mobile stocker of claim 7, further comprising:
    a second communication interface configured to communicate with an overhead hoist transport (OHT) vehicle to at least one of:
        provide a transport carrier to the OHT vehicle at the location, or
        receive a transport carrier from the OHT vehicle at the location.

9. The mobile stocker of claim 8, wherein the second communication interface is configured to perform a handshake procedure with the OHT vehicle to establish a communication connection with the OHT vehicle.

10. A mobile stocker, comprising:
a storage unit configured to store a plurality of transport carriers;
a plurality of wheels, at a bottom of the storage unit, configured to permit the mobile stocker to be moved in a semiconductor fabrication facility;
one or more anchors configured to attach or secure to holes in, or latches on, a floor of the semiconductor fabrication facility; and
a navigation system configured to:
generate a navigation map of a semiconductor fabrication facility, and
autonomously navigate, based on the navigation map, the mobile stocker in a semiconductor fabrication facility.

11. The mobile stocker of claim 10, wherein the navigation map is generated based on the mobile stocker traveling throughout the semiconductor fabrication facility.

12. The mobile stocker of claim 10, wherein the navigation map is generated based on sensor data received as the mobile stocker travels throughout the semiconductor fabrication facility.

13. The mobile stocker of claim 12, wherein the navigation system comprises one or more sensors configured to generate the sensor data.

14. The mobile stocker of claim 10, wherein the navigation system is further configured to:
identify, based on the navigation map, a shortest path from a first location to a second location in the semiconductor fabrication facility; and
autonomously navigate the mobile stocker using the shortest path.

15. A mobile stocker, comprising:
a storage unit configured to store a plurality of transport carriers;
a plurality of wheels, at a bottom of the storage unit, configured to permit the mobile stocker to be moved in a semiconductor fabrication facility;
one or more anchors configured to attach or secure to holes in, or latches on, a floor of the semiconductor fabrication facility; and
a navigation system configured to:
receive, from a material control system (MCS), navigation information, and
autonomously navigate, based on the navigation information, the mobile stocker in a semiconductor fabrication facility.

16. The mobile stocker of claim 15, wherein the navigation information is associated with an unknown or undiscovered location for the mobile stocker.

17. The mobile stocker of claim 15, wherein the navigation information is further configured to:
obtain sensor data based on autonomously navigating the mobile stocker in the semiconductor fabrication facility, and
generate a navigation map based on the sensor data.

18. The mobile stocker of claim 15, further comprising:
a controller configured to provide signals to cause the mobile stocker to autonomously navigate the mobile stocker in the semiconductor fabrication facility.

19. The mobile stocker of claim 18, wherein the signals are provided to one or more wheel motors, of the mobile stocker, to cause the mobile stocker to autonomously navigate the mobile stocker in the semiconductor fabrication facility.

20. The mobile stocker of claim 15, wherein the navigation system comprises one or more navigation devices including at least one of:
a global positioning system (GPS) device,
a wireless station calibration device,
a quick response (QR) code reader device, or
a simultaneous localization and mapping (SLAM) device.

* * * * *